United States Patent [19]

Fiegl et al.

[11] 4,282,184

[45] Aug. 4, 1981

[54] CONTINUOUS REPLENISHMENT OF MOLTEN SEMICONDUCTOR IN A CZOCHRALSKI-PROCESS, SINGLE-CRYSTAL-GROWING FURNACE

[75] Inventors: George Fiegl, Palo Alto; Walter Torbet, Newark, both of Calif.

[73] Assignee: Siltec Corporation, Menlo Park, Calif.

[21] Appl. No.: 83,169

[22] Filed: Oct. 9, 1979

[51] Int. Cl.³ .............................................. C30B 15/12
[52] U.S. Cl. .................................. 422/106; 422/249; 422/112; 156/601; 156/DIG. 83; 156/DIG. 89; 156/DIG. 73
[58] Field of Search ......... 156/601, 618, 608, 617 SP, 156/DIG. 80, DIG. 83, DIG. 89, DIG. 73; 422/247, 249, 253, 106, 108–110, 112; 219/301, 420; 165/180, 181; 414/218, 302

[56] References Cited

U.S. PATENT DOCUMENTS

| | | | |
|---|---|---|---|
| 2,865,519 | 12/1958 | Wessollek | 414/218 |
| 2,977,258 | 3/1961 | Dunkle | 156/608 |
| 3,002,821 | 10/1961 | Haron | 156/608 |
| 3,206,286 | 9/1965 | Bennett et al. | 156/617 SP |
| 3,291,650 | 12/1966 | Dohmen et al. | 156/608 |
| 3,305,485 | 2/1967 | Burmeister et al. | 156/617 SP |
| 3,493,770 | 2/1970 | Dessauer et al. | 250/217 |
| 3,507,625 | 4/1970 | Deyris | 156/617 SP |
| 3,692,499 | 9/1972 | Andrychuk | 156/618 |
| 3,815,623 | 6/1974 | Farmer | 219/301 |
| 3,882,319 | 5/1975 | Clement et al. | 250/577 |
| 3,998,598 | 12/1976 | Bonora | 156/601 |
| 4,036,595 | 7/1977 | Lorenzini et al. | 156/617 SP |
| 4,156,127 | 5/1979 | Sako et al. | 219/301 |

FOREIGN PATENT DOCUMENTS 939102  10/1963  United Kingdom .

*Primary Examiner*—Hiram Bernstein
*Attorney, Agent, or Firm*—C. Michael Zimmerman

[57] ABSTRACT

A replenishment crucible is mounted adjacent the usual drawing crucible, from which a monocrystalline boule is drawn according to the Czochralski method. A siphon tube for molten semiconductor transfer extends from the replenishment crucible to the drawing crucible. Each crucible is enclosed within its own hermetic shell and is provided with its own heater. The siphon tube is initially filled with molten semiconductor by raising the inert atmospheric pressure in the shell surrounding the replenishment crucible above that surrounding the drawing crucible. Thereafter, adjustment of the level of molten semiconductor in the drawing crucible may be achieved by adjusting the level in either crucible, since the siphon tube will establish the same level in both crucibles. For continuous processing, solid semiconductor may be added to and melted in the replenishment crucible during the process of drawing crystals from the drawing crucible. A constant liquid level of melted semiconductor is maintained in the system by an optical monitoring device and any of several electromechanical controls of the rate of replenishment or crucible height.

15 Claims, 4 Drawing Figures

CONTINUOUS REPLENISHMENT OF MOLTEN SEMICONDUCTOR IN A CZOCHRALSKI-PROCESS, SINGLE-CRYSTAL-GROWING FURNACE

The invention described herein was made in the performance of work under NASA Contract No. NAS 7-100, JPL Subcontract No. 954886, and is subject to the provisions of Section 305 of the National Aeronautics Space Act of 1958 (72 STAT 435; 42 U.S.C. 2457).

BACKGROUND OF THE INVENTION

The Czochralski process in which a large monocrystalline boule is drawn slowly from a melt of solidifying semiconductor, starting from a single seed crystal, is of major importance in the production of silicon and other semiconductor devices. In certain respects, the quality of the crystalline structure produced by this process exceeds that producible by the other major competitive process, zone refining.

In order to achieve the excellent quality of crystals which are needed by the semiconductor industry, a number of process variables in the Czochralski process must be carefully monitored and controlled. In particular, the dopant concentration in the melted semiconductor from which the crystal is being pulled must be carefully adjusted to preserve constancy during the process of growing the crystal. This is true especially because the concentration of dopant in the finished crystal is different from that in the molten bath of semiconductor. Consequently, during the process of growing a crystal, there is a tendency for the dopant to either be depleted or overly concentrated because of the differential in segregation coefficients of semiconductor and dopant.

There is furthermore a tendency for the diameter of the crystal to change during the process of drawing it. Since the boule or monocrystal must be ground to a uniform diameter after drawing, any variations in the as-drawn diameter simply require extra grinding, increasing cost and the risk of damage to the semiconductor crystal structure. To minimize such diameter variations the rate at which the solidifying crystal is drawn must be continuously optimized.

Consequently, these and other process parameters have come to be quite rigidly controlled in order to assure maximum quality of the finished semiconductor wafers which will be sliced from the boule. Such control has proven to be feasible more or less at the expense of production speed, by drawing only a single crystal from each "melt" of silicon, for example. At the termination of the crystal drawing process, the furnace is shut down, a new charge of solid silicon is added, the furnace is heated to melt the silicon and the entire process of drawing a new crystal is begun.

While these sorts of batch process have proven adequate to provide silicon wafers at a satisfactorily low cost for semiconductor device fabrication, for example, the resulting cost of the silicon wafers is still too high to permit their widespread application as photovoltaic converters of sunlight.

In order to meet the need for semiconductor wafers which are sufficiently inexpensive, high enough in quality, and abundantly available, it is apparent that the former batch processing technique used in the Czochralski process must be abandoned in favor of a more or less continuous process in which the drawing crucible is recharged with molten semiconductor during the crystal drawing process so that more than one crystal can be drawn without a shutdown to recharge the furnace. Moreover, the already well established production controls over the various process parameters must be extended to this new continuous process such that the result is a net lowering of the cost of the semiconductor boule without any degradation in quality. In short, the yield of acceptable boules (the percentage of those produced which meets quality standards) must be preserved while efficiency and production speed are increased.

Consequently, a means is definitely needed to provide in a simple, continuous, and reliable fashion, a constant melt level in the drawing crucible such that the position of the solid-liquid interface in the crucible does not change. Moreover, this criterion must be met despite the fact that the crucible remains continuously heated, and crystals are formed one after another in a production fashion.

At the same time, the composition of the molten semiconductor must remain uniform. In particular, the concentration of dopant must not be permitted to change either during the growing of a single crystal or from crystal to crystal. Moreover, this last criterion must be met even though the total amount of molten semiconductor present in the drawing crucible at the start of production cannot be made adequate to provide material for an entire production run which might consist of many crystals.

Considering the above criteria, it is obvious that if quality is to be maintained in a mass production crystal growing process, then replenishment of the molten semiconductor in the drawing crucible must be carried out during the production run, with careful control of the composition of the added molten semiconductor.

SUMMARY OF THE INVENTION

Accordingly, the principal object of the present invention is the preservation of acceptable monocrystalline semiconductor quality while increasing the available quantity by the continuous production of crystals from a single drawing crucible.

Another object of the present invention is the preservation of such crystalline quality by means of more or less constant replenishment of the molten semiconductor in the drawing crucible during production operations.

Another object of the present invention is to carry out such replenishment without varying the height of the liquid-solid interface in the drawing crucible.

A further object of the present invention is to carry out such replenishment of molten semiconductor without varying the concentration of dopant in the drawn monocrystals, either from crystal to crystal or within a single crystal.

The above objects can be accomplished according to the present invention by the provision of a melt replenishment crucible containing molten semiconductor adjacent the drawing crucible and connected to the drawing crucible by means of a siphon transfer tube. By means of the siphon tube, molten semiconductor can be continuously transferred to the drawing crucible during production runs without introducing turbulence, ripples, or other disturbances which would degrade the quality of the crystal being grown in the drawing crucible. By ensuring that the atmosphere of inert gas surrounding both the replenishment and drawing crucibles is at the same pressure, such transfer can be accomplished while preserving a constant level of the liquid-solid interface merely by regulating the height of the molten semiconductor in the replenishment crucible so that it is the same as the desired level of molten semiconductor in the drawing crucible.

A further object of the present invention is to ensure that the level of molten semiconductor in the two crucibles is constantly maintained with a minimum of human supervision by automatic means.

To this end the apparatus according to the present invention incorporates an optical level monitoring means to derive an electric signal indicative of the melt level in either or both of the crucibles, and a servomechanical control means for adjusting that level to a desired preselected height.

A further object of the present invention is to ensure that molten semiconductor is transferred reliably from the replenishment crucible to the drawing crucible without solidifying in the transfer means.

To this end the present invention incorporates a siphon transfer tube having an integral electric heater and thermal and electrical insulation means such that even at the very low flow rates occasioned by continuous transfer of melted semiconductor, still no solidification can occur.

These and other features, objects, and advantages of the present invention, together with the best means contemplated by the inventors thereof for carrying out their invention, will become more apparent from reading the following detailed description of a preferred embodiment and perusing the drawings in which:

DETAILED DESCRIPTION OF A PREFERRED EMBODIMENT

Figure 1:
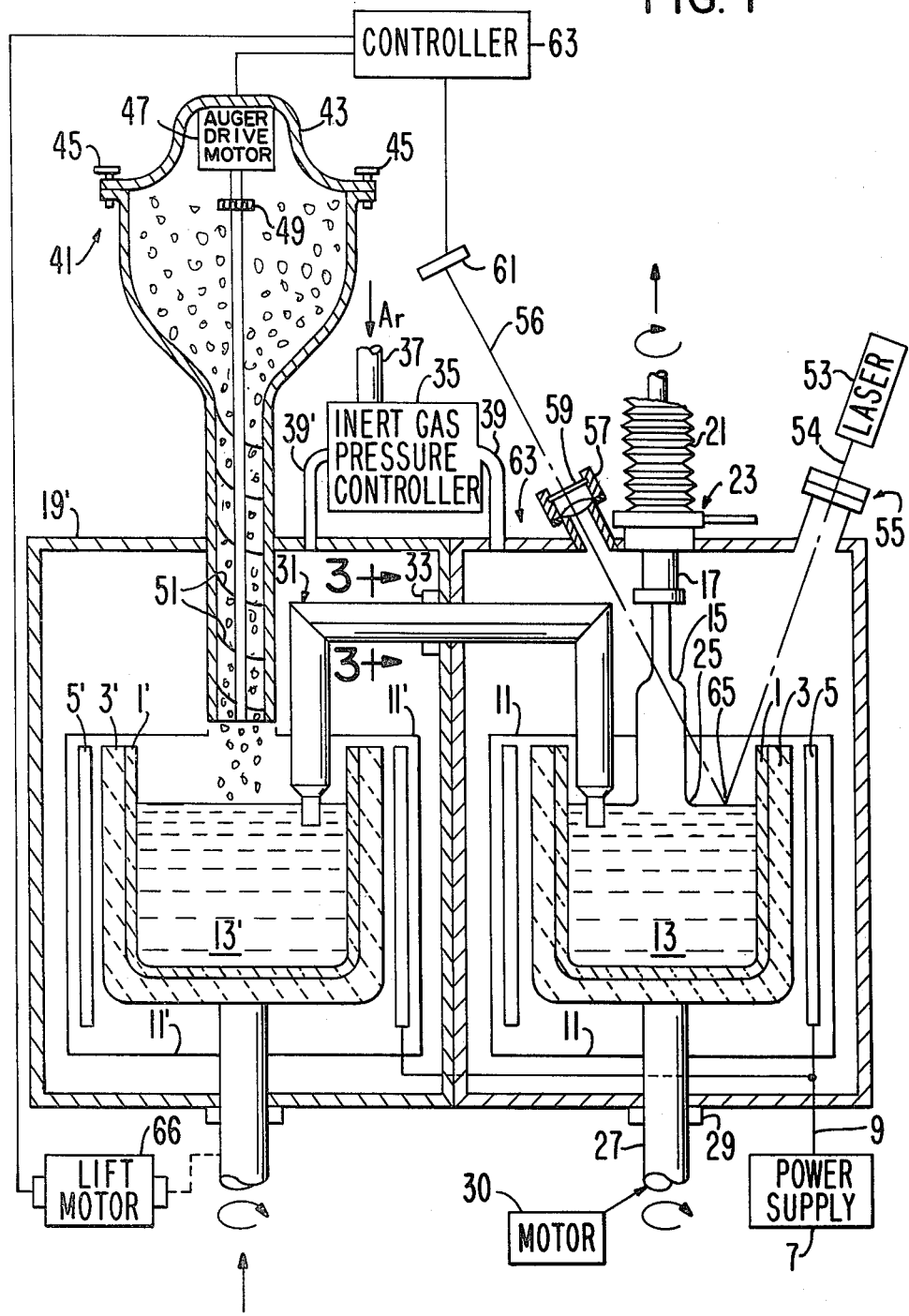
FIG. 1 is a side view partially in elevation and partially in section illustrating a Czochralski process semiconductor crystal growing apparatus according to the present invention.

In FIG. 1 is ilustrated the Czochralski process crystal growing apparatus according to the present invention. A quartz drawing crucible 1 of approximately ten inches diameter is contained within a closely fitting solid graphite susceptor 3 and surrounded by a cylindrical heater 5 which may also be made of graphite. Heater 5 may be of the "picket" type in which the heating elements comprise a series of vertical spaced bars of graphite arranged to form a circular cylinder with short interconnecting links of graphite to connect the vertical members into a series circuit. Alternatively any other known form of heater may be used as desired. Power is supplied to heater 5 by means of an external power supply 7 which connects to heater 5 by means of leads 9.

Since the temperatures involved in growing silicon crystals for example by the Czochralski process are quite high, on the order of 1500° C., a plurality of heat shields 11 indicated generally by a rectilinear pattern of lines in FIG. 1 surrounds the heated zone produced by heater 5. Shields 11 might be made of graphite or a high temperature refractory material such as molybdenum. By minimizing the loss of heat from the high temperature region within heater 5, shields 11 minimize the power requirement of heater 5 and avoid excessive heating of the surrounding environment.

Within drawing crucible 1 is located a body of molten semiconductor, or melt, 13 which could be for example molten silicon. A monocrystalline boule or crystal 15 is slowly grown from melt 13 and is both rotated and pulled upwardly in FIG. 1 by means of a draw rod 17 which is attached at its upper end to a rotating and elevating mechanism (not shown).

Since molten silicon at a highly elevated temperature would be easily damaged by contact with the oxygen and nitrogen in air, the melt of silicon is completely surrounded by a housing 19 which is hermetically sealed from the surrounding air environment and filled with an inert gas such as argon. Consequently, draw rod 17 passes upwardly out of enclosure 19 by means of a hermetically sealed bellows assembly 21, made for example of stainless steel. At the completion of drawing of a single crystal 15, the crystal is pulled upwardly into the area surrounded by bellows 21 and a shutter 23 is closed isolating the draw rod 17 and crystal 15 from the environment within housing 19.

Thereafter, crystal 15 can be removed and the process of growing a subsequent crystal can be started again by opening shutter 23 and reinserting a draw rod 17 having a seed crystal at its tip into contact with the surface of semiconductor melt 13. As is well known, silicon ingots or crystals of a suitably high grade for electrical purposes are prepared according to the Czochralski method by dipping a tiny ("seed") crystal of silicon into the molten mass of silicon and slowly withdrawing the seed crystal. As the seed crystal is withdrawn the molten silicon adhering to it solidifies forming a single large crystalline structure or monocrystal having exactly the same crystallographic orientation as the seed which was used. This is true even though the final ingot or boule so drawn may be as much as forty inches in length and four inches in diameter.

As is conventional practice in the Czochralski process, the diameter of the crystal pulled from the melt is controlled by varying the rate of pull, i.e., the speed with which draw rod 17 is moved upwardly in FIG. 1. Also conventionally, although not shown, the diameter of the crystal being drawn is monitored by means of an optical pyrometer which is aimed at the meniscus 25 between solid crystalline structure 15 and melt 13. Meniscus 25 is easily detected because it appears as a ring of brighter color corresponding to the heat of fusion released at the point of solidification of the semiconductor.

In order to ensure homogeneity and uniformity of the melt 13 from which crystal 15 is being pulled, it is conventional in the Czochralski process to produce rotation in the melt such that a dopant chemical for example is uniformly distributed throughout the melt. Such rotation also helps to prevent non-uniformities in the temperature of melt 13. For this purpose, a shaft 27 passing through a sealed rotating bearing 29 is joined to graphite susceptor 3 and rotated to rotate the entire assembly to quartz crucible 1 susceptor 3 and melt 13. Means to rotate shaft 27 is schematically illustrated at 30.

In order to maintain a constant level of melt 13 in crucible 1 during the crystal pulling operation, an additional supply of molten semiconductor is maintained in the form of melt 13' contained within quartz crucible 1' which in turn is supported by a graphite susceptor 3' and heated by means of a heater 5'. As in the case of the drawing crucible 1, the entire heater, melt and crucible apparatus is surrounded by an enclosure of heat shields 11' indicated generally by a rectilinear pattern of lines in FIG. 1. Conveniently, melt replenishment crucible 1' is located within an adjoining housing 19' located in a side-by-side relationship with housing 19. The two housings may have a common wall or at least be joined together by welding or brazing where they abut.

According to the present invention, molten silicon or other semiconductor can be transferred from melt replenishment crucible 1' to drawing crucible 1 by means of siphon tube 31 which extends through the common wall of housings 19' and 19 by means of a flange 33. Siphon tube 31 will be described in more detail with respect to FIGS. 3 and 4. However, for the present it may be noted that once siphon tube 31 is filled with molten silicon, it serves to transfer this material from melt replenishment crucible 1' to drawing crucible 1 in such an amount as to maintain the level in each crucible the same, so long as the atmospheric pressure within housing 19' is the same as that within housing 19. In this connection, the ends of the siphon tube are respectively immersed as illustrated within the melts 13 and 13', and such tube extends through the inlet opening of drawing crucible 1 so that rotation of the latter is not inhibited by the tube.

In order to control the atmospheric pressure within these housings while maintaining a nonreactive atmosphere adjacent the high temperature melt of semiconductor, an inert gas pressure controller 35 is used. Controller 35 has a gas inlet tube 37 which is connected in use to a source of inert gas under pressure, for example argon. Controller 35 also has a pair of gas supply conduits 39 and 39' connecting respectively to housing 19 and 19'. By means of controller 35, inert gas such as argon may be routed into housings 19 and 19' for the purpose of initially purging these chambers of air, and thereafter conduits 39 and 39' may be interconnected to each other and to regulated argon from gas inlet tube 37 in order to maintain exactly the same pressure of inert gas in each chamber, such that flow of molten semiconductor through siphon tube 31 takes place only under the influence of any level difference existing between semiconductor melts 13 and 13'.

Controller 35 also serves another important purpose within the context of the present invention: In order to initiate the flow of molten semiconductor through siphon tube 31, it is essential to produce a pressure difference between the atmospheres within housings 19 and 19'. Typically, this would be done at the initiation of a production cycle and might consist of raising the pressure of inert gas within housing 19', for example, until molten silicon fills siphon tube 31. Alternatively, the pressure differential could be established by elevating the pressure within housing 19 above that in 19'. It is only important that there be molten semiconductor throughout siphon tube 31 in order for the system to continue to function.

As noted earlier in this application, it is essential in order to preserve adequate quality of monocrystalline boule 15 to maintain a relatively constant height of the surface level of molten semiconductor melt 13. Since the apparatus of FIG. 1 is intended to be used in a more or less continuous production fashion, it is not practical to shut the system down in order to add a fresh supply of polycrystalline silicon or other semiconductor in particle or powder form before drawing each monocrystalline boule 15. Moreover, it is not practical to make crucibles 1 and 1' large enough in capacity with the consequently large heaters 5 and 5' which would be required, in order to have a ready supply of molten semiconductor for the drawing of many crystals. Consequently, in the apparatus of FIG. 1, means to supply solid semiconductor in a polycrystalline form consisting of particles or powder are provided by a hopper 41.

Hopper 41 is shown extending above enclosure 19' to which it may be brazed or welded where it passes through an aperture into housing 19', thereby forming a part of the inert gas-filled system. A lid 43 is held in place in a vacuum-tight fashion by means of removable fasteners 45. Within lid 43 is mounted an auger drive motor 47 which drives by means of a separable coupling 49 an auger 51 for releasing a selected amount of unmelted particulate semiconductor material into melt 13'.

An optical melt level sensing means is provided in the form of a ruby laser 53 which projects a highly collimated beam of red light 54 through an optically transparent vacuum tight port 55 to strike the surface of melt 13 and be reflected along a path 56 to a converging lens 57 and an optical filter 59, finally striking position sensor 61. Converting lens 57 and filter 59 are sealed vacuum-tightly in a port 63 similar to port 55. Lens 57 is so positioned as to focus an image of the illuminated spot 65 on the surface of melt 13, at the plane of position sensor 61. Optical filter 59 is a band pass filter, the band being selected so as to include the light from ruby laser 53 while excluding insofar as possible other sources of light, in particular the light coming from melt 13 at the very high temperatures (on the order of 1500° C.) involved.

Position sensor 61 may be of any known type which will give an output signal indicative of the position of impingement of beam 56 along the surface of sensor 61. In particular, we have had good results from semiconductor sensors supplied by United Detector Technology, Inc. of 2644 Thirtieth Street, Santa Monica, California.

A controller 63 receives the signal from position sensor 61, which signal is, of course, a function of the point of impingement of beam 36 on position sensor 61 which is in turn a function of the level of melt 13 at a point 65 where the light beam from ruby laser 53 strikes. Within controller 63, the signal from position sensor 61 is compared with a reference signal to generate an error signal in well known fashion, from which controller 63 produces the command signals to operate auger drive motor 47 to release more particulate semiconductor material, or to initiate operation of a lift motor 66 to raise or lower melt replenishment crucible 1' and susceptor 3'.

Since changing the height of melt replenishment crucible 1' by means of lift motor 66, or by operating auger 51 to release more solid particulate semiconductor material, both affect the level of melt in crucibles 1 and 1', a means of controlling the proportioning of these two means of level control is needed. Typically this may be done by feeding back a signal from lift motor 66 or its associted gear train mechanism (not shown) for lifting crucible 1', which signal is indicative of the total elevation of crucible 1'.

For example, when in response to consumption of molten semiconductor in crucible 1, the quantitiy of melt 13' remaining in crucible 1' has been sufficiently depleted such that crucible 1' has been lifted by motor 66 to the point where it triggers an upper limit switch (not shown), controller 63 could trigger auger drive motor 47 to release more particulate semiconductor. The increase in the level of melt 13' would be continuously compensated during the release of particulate semiconductor by a lowering of crucible 1' under the control of controller 63 and lift motor 66.

Alternatively, it is possible to control the level of melt 13' and consequently melt 13 simply by control of auger drive motor 47 on a continuous basis, to release particulate semiconductor material at the same rate as it is being drawn from crucible 1. In either case, a suitable commercially available controller such as the Leeds & Northrup "Electromax ® III Controller" may be used.

Figure 2:
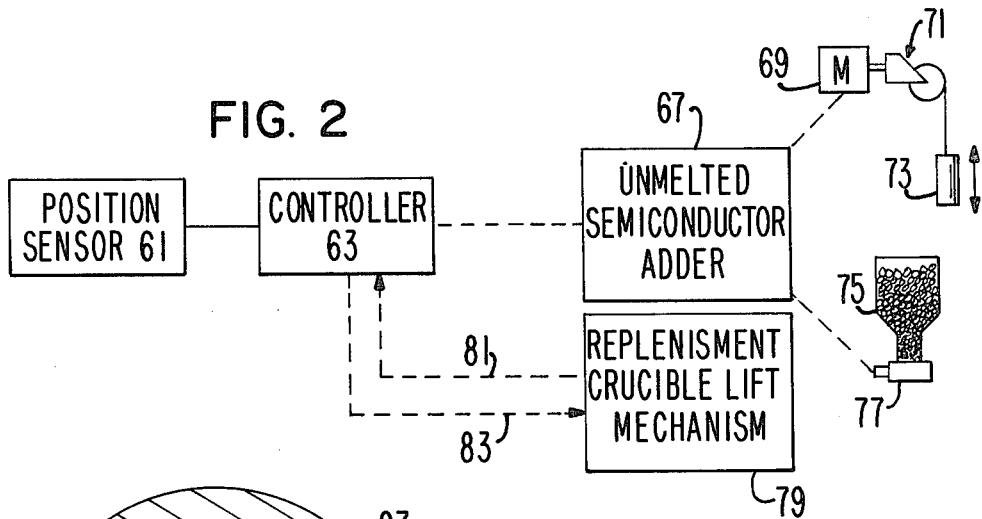
FIG. 2 is a block diagram illustrating a variety of alternative melt level maintenance and control systems useful in the present invention.

In FIG. 2, a generalized diagram in block schematic form of the various controller options available for utilizing the melt level sensor signal to control melt level is illustrated. The signal from position sensor 61 is sent to controller 63 as already described in reference to FIG. 1. From controller 63 a signal may be sent along a dotted line to block 67 labeled "UNMELTED SEMICONDUCTOR ADDER".

Block 67 may be realized in a variety of ways, one of which is illustrated in FIG. 1 in the form of a hopper 41 in combination with an electrically driven auger 51 for dispensing particles of semiconductor. As will readily be apparent, it is possible using such a positive displacement conveyor as typified by auger 51 to make such a system dispense particles on a continuous basis and at a rate exactly equal to the rate at which molten semiconductor material is being consumed in drawing crucible 1. In other words, the system can be entirely proportional.

Many other devices which operate on the same principle to add unmelted semiconductor to replenishment crucible 1' at exactely the same rate as it is being consumed, under the control of position sensor 61 and controller 63 are feasible. This general class of realizations of block 67 has been indicated in FIG. 2 by the combination of a motor 69 driving a geared pully mechanism 71 to raise or lower a solid block of unmelted polycrystalline semiconductor 73 into a melt replenishment crucible such as 1' in FIG. 1.

In any case, it is to be understood that any form of solid semiconductor material added for replenishment will contain whatever dopant(s) is needed in the same proportion as is present in the drawing crystal. In this sense, the maintenance of melt level by replenishment has a distant advantage over prior art techniques of depleting the melt during the crystal drawing operation. As discussed earlier in this application, because of the differential segregation coefficients of the semiconductor and dopant, in the past there has been an inevitable slight variation in doping level in the drawing crystal unless the dopant concentration of the melt was adjusted during the drawing operation. However, by the technique of melt level maintenance by replenishment, dopant concentration can be simply held constant.

A second class of realizations of block 67 in FIG. 2 is schematically represented by a hopper 75 containing particulate or powdered semiconductor material to be melted, and the lower end of hopper 75 being closed by an electromagnetically actuated unit dispenser 77. Dispenser 77 releases a preselected quantity, or unit, of particulate semiconductor each time it is actuated. In short, while the general class of embodiments illustrated by elements 69–73 may be thought of as proportional, continuous analog devices, the class of embodiments represented by elements 75 and 77 may be thought of as providing stepwise or digital approaches to the problem of melt replenishment. However, it must be realized that to a certain extent this distinction is somewhat artificial. For example, the class of devices represented by elements 69–73 may also be operated in a stepwise fashion, whereas by making the size of the unit additions from elements 75 and 77 very small, the rate of addition can be made to approach very closely the rate at which semiconductor is being depleted during the crystal drawing operation.

A pair of dotted lines 81 and 83 is shown connecting the block of controller 63 to block 79 "REPLENISHMENT CRUCIBLE LIFT MECHANISM". As discussed earlier with respect to FIG. 1, controller 63 may control a mechanism to raise melt replenishment crucible 1' as molten semiconductor is used in drawing crucible 1. The purposes for which such control may be utilized are two-fold:

(1) in the case that the crystal drawing apparatus is to be used for a batch operation wherein the quantity of molten semiconductor available from both crucibles will be adequate to supply the needed material for drawing the crystals;
(2) in the case that the semiconductor adder of block 67 of the stepwise variety exemplified by hopper 75 and electromagnetically actuated unit dispenser 77, such that the replenishment crucible lift mechanism is used for readjusting the level of melt in the crucibles immediately after the addition of each unit of unmelted semiconductor.

In the case (1) of batch operation of the apparatus, the controller 63 may be used to regulate raising both crucibles in order to increase the melt quantity available for the drawing of crystals.

In the form of operation (2) above, continuous proportional control of the melt level is achieved by movement of the replenishment crucible 1' while stepwise additions of unmelted semiconductor are added from time to time as semiconductor melt is depleted. For this type of operation as discussed in regard to FIG. 1, a convenient means of triggering the addition of each quantity of unmelted semiconductor is provided from a signal fed back along line 81 from replenishment crucible lift mechanism 79.

Such a signal could be most simply generated by providing an upper limit switch within the crucible lift mechanism such that when crucible 1' has risen by a given amount in response to depletion of semiconductor melt, the lift mechanism generates a trigger signal which is fed back to controller 63 along dotted line 81, for example. Control signals from controller 63 are provided to crucible lift mechanism 79 along dotted line 83, permitting continuous control of melt level in response to the signals from position sensor 61.

Figure 3:
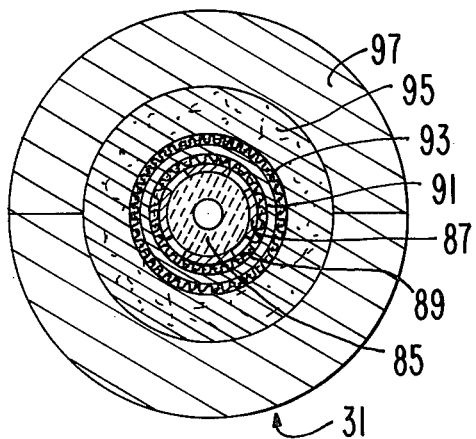
FIG. 3 is a cross-sectional view taken along lines 3—3 in FIG. 1.

In FIG. 3, details of the construction of siphon tube 31 are shown. A quartz tube 85 forms the actual conduit for transporting the molten semiconductor material between crucibles 1 and 1'. Tube 85 may be 1.000 inch in outside diameter and 7 mm in inside diameter.

The material of tube 85 must be non-contaminating to the semiconductor material in use and should possess adequate resistance to erosion and wear at the very high temperatures involed (on the order of 1500° C.). In systems for producing silicon monocyrstals, quartz is the most satisfactory material. Since it is necessary to preserve the semiconductor material within tube 85 in a molten condition at all times and at all points along siphon tube 31, a rather complex thermal structure surrounds tube 85.

Immediately overlaying quartz tube 85 is a surface heating element 87 formed basically of strips of pure flexible graphite which have highly directional properties, conducting readily in a direction along the sheet. Such flexible graphite is available in both tape and sheet form under the trademark "Grafoil". The details of the formation and shaping of surface heater 87 will be dealt with in connection with FIG. 4. Heater 87 is held in place by being bonded with a cyanoacrylate cement, such as that sold under the trademark Eastman 910 ®.

Immediately overlaying heater 87 is a layer of silica tape 89 consisting of a fabric of high purity fibres of $SiO_2$, serving as an insulating layer.

Immediately overlaying layer 89 are a second flexible graphite sheet layer 91 and a second silica tape insulating barrier 93. The second flexible graphite sheet layer 91 which is electrically insulated from the surface heater 87 simply serves as an insulative and mechanically isolating barrier, to prevent graphite fibres from a graphite felt layer 95 from penetrating through silica tape layer 89 and creating unwanted current leakage paths.

Graphite felt layer 95 which may consist, for example, of two layers of ¼-inch thick graphite felt provides additional thermal insulation. Finally, an outer hard shell 97 is formed of pure solid graphite. Shell 97 provides considerable rigidity and strength to the entire structure of siphon tube 31 while increasing the thermal insulation properties. As can readily be appreciated, at the high temperatures involved good thermal insulation is a necessity to avoid unwanted cool spots along the length of siphon tub 31, where molten semiconductor materials could solidify and cause a shutdown of the entire apparatus.

As can be seen in FIG. 3, the long horizontal portion of graphite shell 97 is split longitudinally to permit mounting it over the correspondingly shaped portion of quartz tube 85. However, the vertical rising portions at the ends of siphon tube 31 may either be made split or, more conveniently, as solid pieces which slip over the underlying insulation layers. In the event that this construction is adopted, additional layers of flexible graphite sheet may be employed between graphite shell 97 and graphite felt layer 95 or between graphite felt layer 95 and silica tape layer 93 or in both locations to permit easy slippage between the mating parts.

Figure 4:
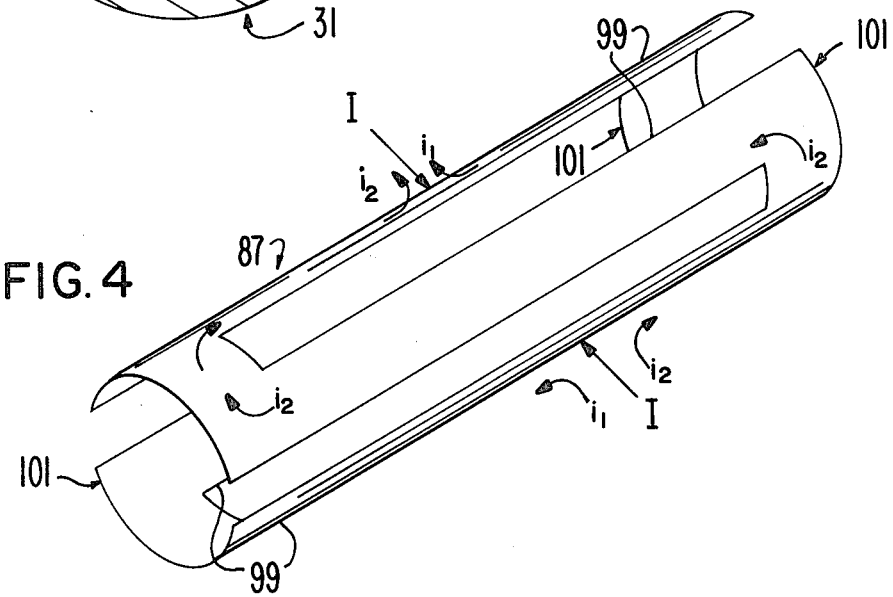
FIG. 4 is a perspective view of a novel siphon tube heater according to the present invention.

Turning now to FIG. 4, the configuration of surface heater 87 is shown. As can be seen in FIG. 4, heater 87 consists principally of four longitudinally extending flexible graphite strips 99 which when positioned about the outside diameter of quartz tube 85 are evenly spaced, 90° apart, and cover approximately 50% of the total circumference of quartz tube 85.

By means of four interconnecting flexible graphite links 101, one pairs of longitudinal strips 99 are electrically interconnected in series circuit relationship at the two ends of heater 87. However, as can be seen in FIG. 4, links 101 are oriented differently at the two ends of heater 87: In fact, the pairs of links 101 at one end of heater 87 are oriented in a position 90° rotated about the longitudinal axis of heater 87 from the pair of links at the other end of heater 87.

This particular circuit arrangement provides for additional heat input near the ends of quartz tube 85 where it emerges from the surrounding insulator materials 89-97. It is precisely at these points that unwanted solidification of the molten semiconductor material is most likely to occur, especially at very low flow rates such as will normally be encountered in a continuous transfer system like that of the present invention. By providing a pair or interconnecting links 101 made of the same resistive material (flexible graphite) as the remaining portions of heater 87, the thermal current in watts per square centimeter flowing from heater 87 radially into quartz tube 85 will be greatest at the axial end portions of heater 87.

Another important advantage of the arrangement of heater 87 is that by energizing heater 87 with current contacts positioned to fall on a diameter of heater 87 passing through an opposite pair of strips 99 as illustrated by the arrows marked "I" in FIG. 4, the heater is electrically divided into a pair of equal resistance parallel loops—a fact which remains true no matter where the current carrying contacts are positioned longitudinally along strips 99. All that is essential is that the current contacts lie on the same diameter, passing through a pair of strips 99 of heater 87.

Current I breaks into two currents which are illustrated in FIG. 4 as $i_1$ and $i_2$. The path of $i_2$ has been indicated in FIG. 4 since it passes over conductors which are visible in the perspective of FIG. 4. As will be readily apparent from a moment's reflection, $i_2$ travels along exactly one half the total length of conductor of heater 87, and this remains true no matter where along conductors 99 the contacts indicated schematically by the arrows I—I are shifted. Similarly, current $i_1$ also travels along exactly one half the total conductor length of heater 87—the other half not traversed by component current $i_2$.

In practice, although not shown in the drawings, a pair of refractory metal conductors as of molybdenum are conveniently positioned anywhere along the horizontal section of siphon tube 31 and extend inwardly in the region between the split halves of shell 97 and may be held in place by being wrapped in contact with flexible graphite heater 87 with silica tape. These conditions are used to connect heater 87 to a power supply which may be power supply 7 of FIG. 1 or may be a separate supply providing unidirectional alternating current and approximately 1.5 KW of power.

Although the invention has been described with some particularity in reference to a single set of embodiments which taken together comprise the best mode contemplated by the inventors for carrying out their invention, it will be obvious to the skilled worker in the art that many modifications could be made and many alternative embodiments thus derived without departing from the scope of the invention. Consequently, it is intended that the scope of the invention be interpreted only from the following claims.

What is claimed is:

1. Apparatus for producing solid crystals from a melted material comprising:
   A. a drawing crucible for containing a melt of said material from which a solidifying crystal is drawn;
   B. crystal drawing means to progressively draw a solidifying crystal from melt contained in said drawing crucible;
   C. heater means surrounding said drawing crucible for applying the thermal energy to said melt required to permit formation of said solidifying crystal;

D. means to rotate said drawing crucible relative to said heater during the drawing of a solidifying crystal from melt contained therein;

E. a melt replenishment crucible separate from but adjacent to said drawing crucible, containing melt for replenishing melt in said drawing crucible;

F. heater surrounding said replenishment crucible for forming and maintaining a melt of said material in said replenishment crucible;

G. a siphon tube providing fluid communication between said drawing and melt replenishment crucibles, said tube having its opposite ends respectively immersed within the melt contained in said replenishment crucible and within the melt contained in said drawing crucible;

H. means to initiate flow of melted material through said siphon tube;

I. level sensing means to sense the level of said melted material in one of said crucibles and generate an electrical signal indicative of said sensed level; and J. level control means responsive to said sensed level for automatically controlling the level of melt in said drawing crucible, said level control means including a lift mechanism connected to said replenishment crucible for changing the elevation of the same relative to said drawing crucible and thereby cause automatic flow of melt material between said replenishment and drawing crucibles through said siphon tube to control the melt level in the drawing crucible.

2. The apparatus of claim 1 further including means to establish and maintain an atmosphere of inert gas in contact with the surface of said melted material in said drawing and melt replenishment crucibles; and wherein said means to initiate flow of melted material through said siphon tube includes means to produce a selectable atmospheric pressure differential in said inert gas between said melt replenishment crucible and said drawing crucible.

3. The apparatus of claim 1 further including siphon tube heater means on said siphon tube means to prevent solidification of said melted material in said siphon tube means.

4. The apparatus of claim 1 further including replenishment means to add solid crystalline material to said melt replenishment crucible during the solidification of said crystal in said drawing crucible, and wherein said level control means acts to control the rate at which said solid crystalline material is added to said replenishment crucible.

5. The apparatus of claim 4 wherein said solid crystalline material is in the form of particles, and wherein said replenishment includes a hopper for storing said particles and particle transfer means to selectably said particles to said replenishment crucible from said hopper, said level control means acting oontrol said particle transfer means to restore said sensed level to a preselected level.

6. The apparatus of claim 5 wherein said particle transfer means comprises a positive-displacement conveyor.

7. The apparatus of claim 5 wherein said particle transfer means comprises an auger conveyor driven by an electric motor, and wherein said level control means controls said electric motor.

8. The apparatus of claim 1 wherein said level sensing means comprises a source of a light beam irradiating the surface of said melted material at an oblique angle of incidence, and means to intercept the reflected beam of light and to produce therefrom an electric signal indicative of the level of said surface.

9. The apparatus of claim 8 wherein said means of said reflected beam of light, said position sensor producing an electric signal indicative of the location of the point of interception of said light beam on said position sensor, and a converging lens positioned in the path of said reflected beam of light between said position sensor and said surface of said melted material, said lens and position sensor being so disposed with respect to said surface as to cause an image of that portion of said surface which is illuminated by said light beam to be focused on said position sensor.

10. The apparatus of claim 9 further including an optical bandpass filter in said path of said reflected beam of light, the bandpass of said filter being selected to include light from said source and to exclude light generated by said melted material.

11. The apparatus of claim 3 wherein said heater means is an electrical resistance surface heater circumscribing and extending along said siphon tube outside of said melts, provided with contacts for connection with an external source of electric power.

12. The apparatus of claim 14 wherein said heater comprises a plurality of longitudinally extending circumferentially spaced resistive strips extending along the length of said siphon tube, a first circumferentially extending resistive link electrically interconnecting a pair of said strips at one end therof, and a second circumferentially extending resistive link at the other end of said strips and forming a series circuit including said first link.

13. The apparatus of claim 11 wherein said heater is formed from flexible graphite sheet.

14. The apparatus of claim 1 wherein said drawing crucible includes an annularly unobstructed inlet opening above the level of the melt therein and said siphon tube extends from said melt replenishment crucible through said annularly unobstructed inlet opening whereby the presence of said tube does not interfere with rotation of said drawing crucible during the drawing of a crystal from melt contained therein.

15. The apparatus of claim 1 wherein said heater means surrounding said replenishment crucible is separate and apart from said heater means separating said drawing crucible.

* * * * *